US007820507B2

(12) United States Patent
Choi

(10) Patent No.: US 7,820,507 B2
(45) Date of Patent: Oct. 26, 2010

(54) SEMICONDUCTOR DEVICE AND METHOD FOR FABRICATING THE SAME

(75) Inventor: Hyung-Bok Choi, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 639 days.

(21) Appl. No.: 11/296,098

(22) Filed: Dec. 6, 2005

(65) Prior Publication Data

US 2007/0045703 A1     Mar. 1, 2007

(30) Foreign Application Priority Data

Aug. 25, 2005   (KR)  .................. 10-2005-0078288

(51) Int. Cl.
*H01L 21/8242*   (2006.01)

(52) U.S. Cl. ............... 438/253; 438/396; 257/E21.396; 257/E21.008

(58) Field of Classification Search ................. 257/745; 438/253

See application file for complete search history.

(56) References Cited

U.S. PATENT DOCUMENTS

| | | | |
|---|---|---|---|
| 6,168,989 B1 * | 1/2001 | Chiang et al. ............... 438/253 |
| 6,239,022 B1 * | 5/2001 | Seo et al. ................... 438/629 |
| 6,645,846 B2 * | 11/2003 | Drynan et al. .............. 438/622 |
| 7,132,326 B2 * | 11/2006 | Lee et al. .................... 438/253 |
| 2002/0146899 A1 * | 10/2002 | Chun ........................ 438/618 |
| 2002/0187578 A1 * | 12/2002 | Hong ........................... 438/40 |
| 2002/0190294 A1 * | 12/2002 | Iizuka et al. ................. 257/296 |
| 2003/0122174 A1 * | 7/2003 | Fukuzumi ................... 257/306 |
| 2003/0153146 A1 * | 8/2003 | Won et al. ................... 438/253 |
| 2004/0029372 A1 * | 2/2004 | Jang et al. ................... 438/586 |
| 2004/0108536 A1 | 6/2004 | Lee et al. |
| 2004/0145057 A1 * | 7/2004 | Choi .......................... 257/758 |
| 2004/0219744 A1 | 11/2004 | Oh et al. |
| 2004/0227175 A1 * | 11/2004 | Iijima et al. ................. 257/309 |
| 2004/0238867 A1 * | 12/2004 | Park .......................... 257/300 |
| 2004/0262661 A1 * | 12/2004 | Kim et al. ................... 257/303 |
| 2007/0037394 A1 * | 2/2007 | Su et al. ..................... 438/687 |

FOREIGN PATENT DOCUMENTS

| | | |
|---|---|---|
| CN | 1411060 | 4/2003 |
| KR | 2001-0061021 | 7/2001 |

* cited by examiner

*Primary Examiner*—Kiesha R Bryant
*Assistant Examiner*—Igwe U Anya
(74) *Attorney, Agent, or Firm*—Blakely, Sokoloff, Taylor & Zafman

(57) ABSTRACT

A semiconductor device and a method for fabricating the same are provided. The semiconductor device includes: an inter-layer dielectric (ILD) layer formed on a semiconductor substrate; a contact plug formed in the ILD layer, such that a predetermined portion of the contact plug protrudes above the ILD layer; an etch stop layer formed on the ILD layer exposing a top portion of the contact plug; and a bottom electrode of a capacitor formed partially in the etch stop layer to be isolated from the ILD layer by the etch stop layer and the contact plug to prevent a direct contact with the ILD layer, and to be partially contacted with the contact plug.

26 Claims, 7 Drawing Sheets

SEMICONDUCTOR DEVICE AND METHOD FOR FABRICATING THE SAME

FIELD OF THE INVENTION

The present invention relates to a semiconductor device and a method for fabricating the same; and, more particularly, to a metal-insulator-metal (MIM) capacitor in a semiconductor device, wherein the MIM capacitor includes a cylinder-type bottom electrode and a method for fabricating the same.

DESCRIPTION OF RELATED ARTS

Generally, a capacitor in a memory cell includes a bottom electrode for a storage node dielectric layer and an upper electrode for a plate. Herein, it is important to secure the capacitance required for device operations within a limited cell region to cope with the large integration scale.

Conventionally, such capacitance is secured by forming the bottom electrodes in cylinder-type or concave-type to increase the surface area. However, there is a limitation in increasing the surface area of the concave-type bottom electrodes, and thus sufficient capacitance is difficult to obtain. Therefore, the cylinder-type capacitor is used to secure capacitance recently.

Hereinafter, referring to FIG. 1, a method for fabricating a conventional cylinder-type capacitor is described. FIG. 1 is a cross-sectional view illustrating the conventional cylinder-type capacitor.

Firstly, bit lines, although not illustrated, are formed on a semiconductor substrate 10, on which a semiconductor circuit such as a metal-oxide-semiconductor (MOS) transistor, although not illustrated, is formed. Then, an oxide-based inter-layer dielectric (ILD) layer 12 is formed over the above resulting substrate structure including the bit lines and the substrate 10. Next, a contact hole, although not illustrated, exposing a predetermined portion of the substrate 10 is formed on the above resulting substrate structure. Then, a polysilicon layer is formed over the above resulting substrate structure including the contact hole, and then the surface of the polysilicon layer is planarized to form a storage node contact plug 14.

Subsequently, a nitride-based etch stop layer 16 and an oxide-based sacrificial insulation layer, although not illustrated, are sequentially formed over the ILD layer 12 including the storage node contact plug 14. Then, a predetermined portion of the sacrificial insulation layer and the etch stop layer 16 is etched to form an opening, although not illustrated, exposing the storage node contact plug 14. When forming such opening, the opening and the contact plug 14 are misaligned, typically. Such misalignment is caused by a lack of alignment margin of a photo mask equipment used in the opening formation.

Furthermore, a barrier metal layer 18 is formed on the exposed portion of the storage node contact plug 14. In detail, titanium (Ti) is formed on the sacrificial insulation layer including the opening, and then a silicide process is performed to form the barrier metal layer 18 made of $TiSi_x$, wherein x is a natural number, on the storage node contact plug 14. Herein, $TiSi_x$ is formed by a reaction between Ti and silicon (Si) in the storage node contact plug 14. Then, non-reacted portions of Ti are removed through a wet strip process.

Moreover, titanium nitride (TiN) is formed as a bottom electrode material of the capacitor over the above resulting substrate structure. Herein, a portion of TiN becomes contacted with the ILD layer 12 due to the above-described misalignment between the opening and the contact plug 14. Then, portions of TiN exposed above the sacrificial insulation layer is removed by etching and a bottom electrode 20 is isolated with the adjacent portions of TiN.

Next, a wet dip out process is performed to remove the sacrificial insulation layer. Thus, the U-shaped cylinder-type bottom electrode 20 which protrudes over the etch stop layer 16 is formed.

However, during the wet dip out process, a chemical used in the wet dip out process penetrates into the ILD layer 12 through the portion of the bottom electrode 20 in contact with the ILD layer 12, and dissolves a portion of the ILD layer 12. For reference, such an effect where a portion of the ILD layer 12 is dissolved is called a bunker defect, and the bunker defect is denoted in FIG. 1 as 'B'. Such bunker defect is generated because the surface of the TiN layer, generally used as the bottom electrode 20, is formed in grain shapes with a columnar structure. That is, through the grains of TiN forming the bottom electrode 20, the chemical penetrates into the ILD layer 12 through the contact region between the bottom electrode 20 and the ILD layer 12 and often generates the bunker defect. Such bunker defect may cause a fail of a chip.

SUMMARY OF THE INVENTION

It is, therefore, an object of the present invention to provide a semiconductor device capable of preventing bunker defects and a method for fabricating the same.

In accordance with an aspect of the present invention, there is provided a semiconductor device, including: an inter-layer dielectric (ILD) layer formed on a semiconductor substrate; a contact plug formed in the ILD layer, such that a predetermined portion of the contact plug protrudes above the ILD layer; an etch stop layer formed on the ILD layer exposing a top portion of the contact plug; and a bottom electrode of a capacitor formed partially in the etch stop layer to be isolated from the ILD layer by the etch stop layer and the contact plug to prevent a direct contact with the ILD layer, and to be partially contacted with the contact plug.

In accordance with another aspect of the present invention, there is provided a method for fabricating a semiconductor device, including: forming an ILD layer in which a contact plug is formed on a substrate; recessing the ILD layer in a predetermined depth to protrude a predetermined portion of the contact plug above the ILD layer; forming an etch stop layer on the ILD layer, covering the contact plug; forming a sacrificial insulation layer on the etch stop layer with an etch selectivity ratio different from the etch stop layer; etching the sacrificial insulation layer and the etch stop layer to form an opening exposing a predetermined portion of the contact plug; forming a bottom electrode of a capacitor over the opening and the sacrificial insulation layer; and removing the sacrificial insulation layer.

BRIEF DESCRIPTION OF THE DRAWINGS

The above and other objects and features of the present invention will become better understood with respect to the following description of the specific embodiments given in conjunction with the accompanying drawings, in which.

DETAILED DESCRIPTION OF THE INVENTION

Figure 1:
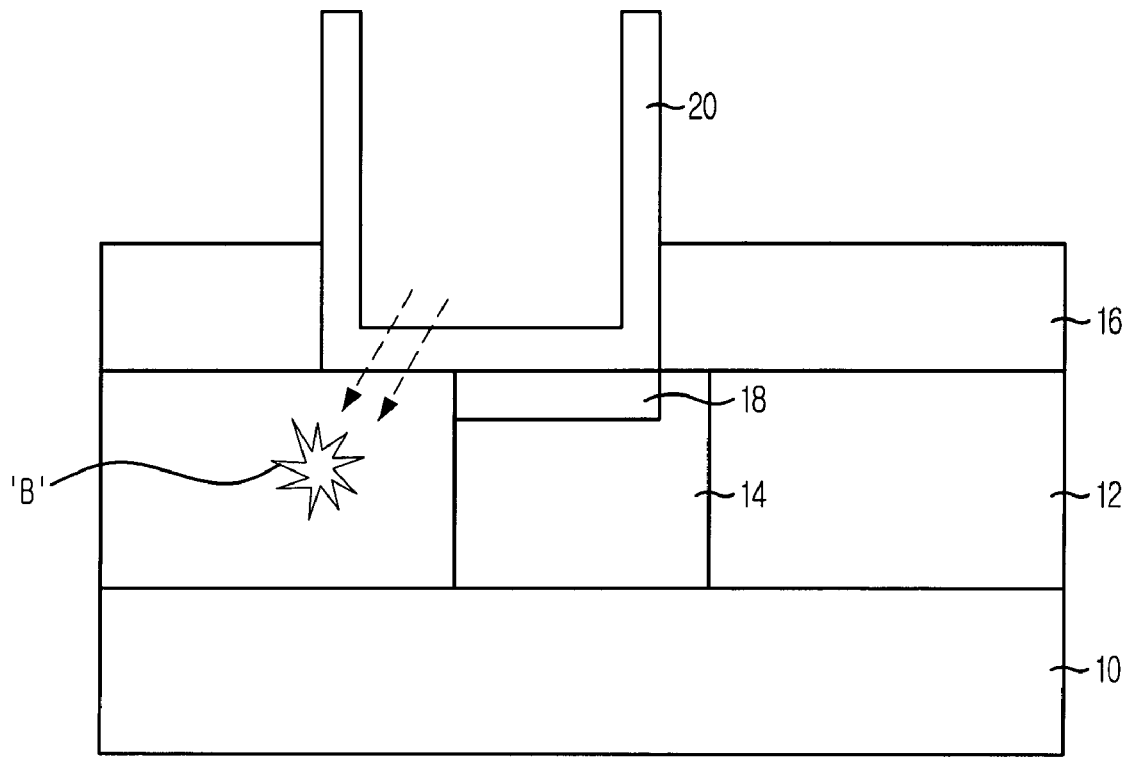
FIG. 1 is a cross-sectional view illustrating a conventional cylinder-type capacitor in a semiconductor device.

A semiconductor device and a method for fabricating the same in accordance with specific embodiments of the present invention will be described in detail with reference to the accompanying drawings. Also, regarding the drawings, the illustrated thickness of layers and regions are exaggerated for definitude. When a first layer is referred to as being on a second layer or "on" a substrate, it could mean that the first layer is formed right on the second layer or the substrate, or it could also mean that a third layer may exit between the first layer and the substrate. Furthermore, identical reference numerals through out the specific embodiments of the present invention represent identical or like elements.

Figure 2:
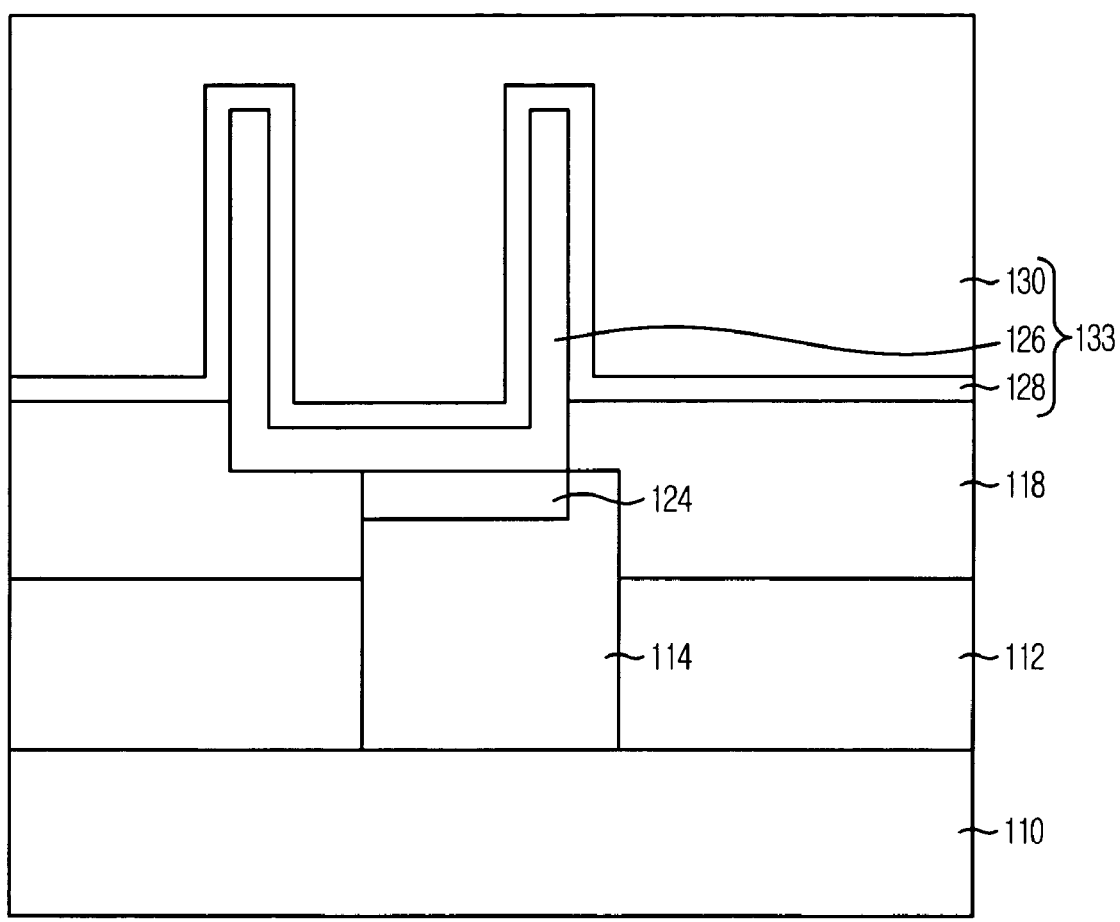
FIG. 2 is a cross-sectional view illustrating a semiconductor device in accordance with a specific embodiment of the present invention.

FIG. 2 is a cross-sectional view illustrating a semiconductor device in accordance with a specific embodiment of the present invention.

Referring to FIG. 2, the semiconductor device in accordance with the specific embodiment of the present invention includes: an inter-layer dielectric (ILD) layer 112 formed on a substrate 110; a contact plug 114 formed in the ILD layer 112 such that a predetermined portion of the contact plug protrudes above the ILD layer 112; an etch stop layer 118 formed on the ILD layer 112 exposing a top portion of the contact plug 114; and a bottom electrode 126 of a capacitor, which is isolated from the ILD layer 112 by the etch stop layer 118 and the contact plug 114 in order to prevent a direct contact, and partially contacting the contact plug 114.

Also, the semiconductor device in accordance with the specific embodiment of the present invention further includes: a dielectric layer 128 formed over the above resulting substrate structure; and an upper electrode 130 of the capacitor formed over the dielectric layer 128 with a height difference. Additionally, a barrier metal layer 124 formed on a portion of the contact plug 114 is further included.

Herein, the bottom electrode 126 is formed with titanium nitride (TiN), and the dielectric layer 128 is formed by employing one material selected from the group consisting of tantalum oxynitride (TaON), tantalum oxide ($Ta_2O_5$), titanium oxide ($TiO_2$), aluminum oxide ($Al_2O_3$), hafnium oxide ($HfO_2$), hafnium nitride (HfN), $SrTiO_3$, (barium (Ba), strontium (Sr)) titanium oxide peroxide ($TiO_3$), and (lead (Pb), Sr) $TiO_3$. Also, the upper electrode 130 is formed by employing one material selected from the group consisting of TiN, ruthenium (Ru), and polysilicon. Thus, a metal-insulator-metal (MIM) capacitor 133 with a MIM structure such as a TiN/TaON/TiN structure is formed.

At this point, the bottom electrode 126 is formed in cylinder-type, such that predetermined portions of the bottom electrode 126 protrude above the etch stop layer 118 in a thickness ranging from approximately 50 Å to approximately 1,000 Å. Also, the dielectric layer 128 is formed in a thickness ranging from approximately 50 Å to approximately 400 Å, and the upper electrode 130 is formed in a thickness ranging from approximately 500 Å to approximately 3,000 Å.

On the other hand, the etch stop layer 118 is formed by employing a material with an etch selectivity ratio different from the ILD layer 112, e.g., a nitride-based material. Preferably, the etch stop layer 118 is formed with silicon nitride ($Si_3N_4$). Also, the etch stop layer 118 is formed in a thickness ranging from approximately 100 Å to approximately 2,000 Å.

The barrier metal layer 124 is formed by employing one material selected from the group consisting of $Si_x$, $CoSi_x$, and $ZrSi_x$, to reduce contact resistance between the contact plug 114 and the bottom electrode 126. Herein, x is a natural number. Preferably, the barrier metal layer 124 is formed with $TiSi_x$ in a thickness ranging from approximately 50 Å to approximately 1,000 Å.

In conclusion, in this semiconductor device in accordance with the specific embodiment of the present invention, the nitride-based etch stop layer 118 is formed between the bottom electrode 126 and the ILD layer 112 to prevent a direct contact between the bottom electrode 126 and the ILD layer 112. Thus, the bottom electrode 126 and the ILD layer 112 are isolated from each other with a certain spacing distance. Through this isolation, a bunker defect generated through the contact region of the bottom electrode 126 and the ILD layer 112 can be prevented.

FIGS. 3 to 9 are cross-sectional views illustrating a method for fabricating the semiconductor device in FIG. 2.

Figure 3:
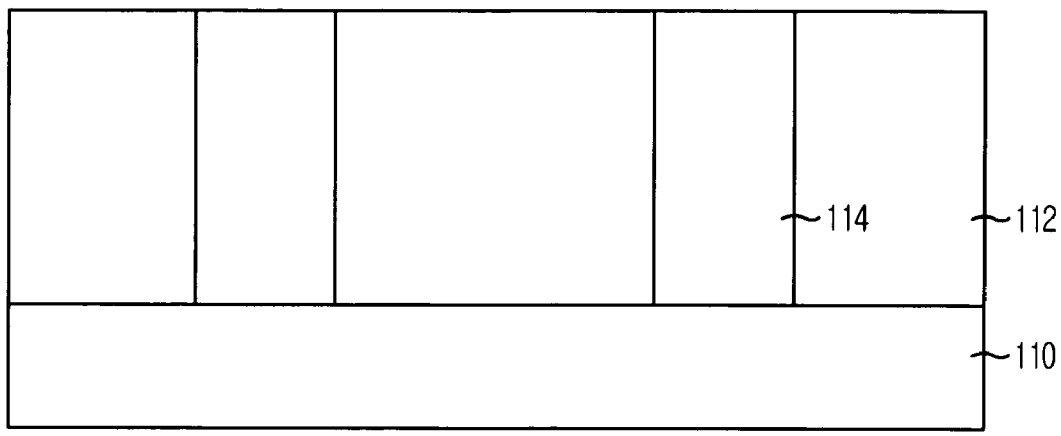
FIGS. 3 to 9 are cross-sectional views illustrating a method for fabricating a semiconductor device in accordance with the specific embodiment of the present invention.

As illustrated in FIG. 3, an ILD layer 112 is formed on a substrate 110 on which a transistor for word lines and bit lines, although not illustrated, are already formed. Herein, the ILD layer 112 is formed by employing an oxide-based material. For example, the ILD layer 112 is formed by employing one selected from the group consisting of a high density plasma (HDP) oxide layer, a boron phosphorus silicate glass (BPSG) layer, a phosphorus silicate (PSG) layer, a plasma enhance tetra ethyle ortho silicate (PETEOS) layer, a plasma enhance chemical vapor deposition (PECVD) layer, a un-doped silicate glass (USG) layer, a fluorinated silicate glass (FSG) layer, a carbon doped oxide (CDO) layer, an organic silicate glass (OSG) layer, and a combination thereof.

Subsequently, the ILD layer 112 is etched by performing a mask process and an etching process. Thus, a plurality of contact holes are formed, exposing predetermined portions of the substrate 110, although not illustrated.

Furthermore, a plug material, i.e., polysilicon, is formed over the above resulting substrate structure, filling the plurality of contact holes. Then, an etch-back or a chemical mechanical polishing (CMP) process is performed on the above resulting substrate structure. Thus, a plurality of storage node contact plugs 114 (hereinafter referred to as the contact plugs) buried in the plurality of contact holes are formed.

Figure 4:
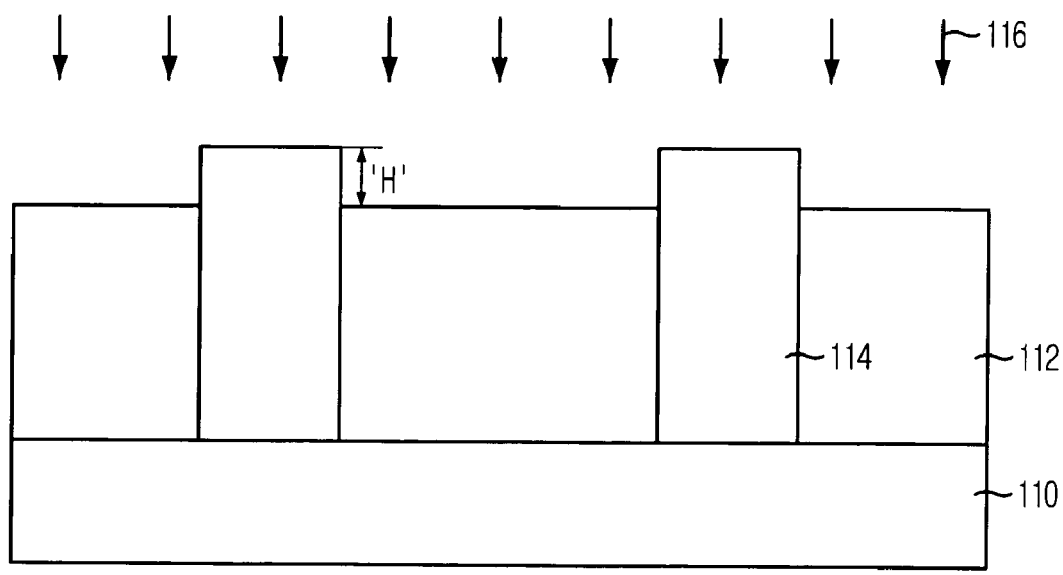

Moreover, as shown in FIG. 4, an etching process 116 is performed to recess the ILD layer 112 in a predetermined depth 'H' such that a predetermined portion of the contact plugs protrude above the ILD layer 112. Herein, the etching process 116 is performed by using an etch selectivity ratio between the ILD layer 112 made of oxide and the contact plug 114 made of polysilicon. At this point, the predetermined depth 'H' ranges from approximately 100 Å to approximately 4,000 Å. Preferably, the predetermined depth 'H' should be approximately 1,000 Å. Herein, the depth 1,000 Å is an optimized depth to prevent the bit lines formed inside the ILD layer 112 from being damaged.

As described above, the ILD layer 112 is recessed in the predetermined depth 'H' beforehand to prevent a direct contact between follow-up bottom electrodes 126 (refer to FIG. 7) and the ILD layer 112. Thus, a chemical used in a wet dip out process for removing a follow-up sacrificial insulation layer 120 (refer to FIG. 5) is prevented from penetrating into the ILD layer 112. Therefore, a bunker defect of the ILD layer 112 is prevented.

Figure 5:
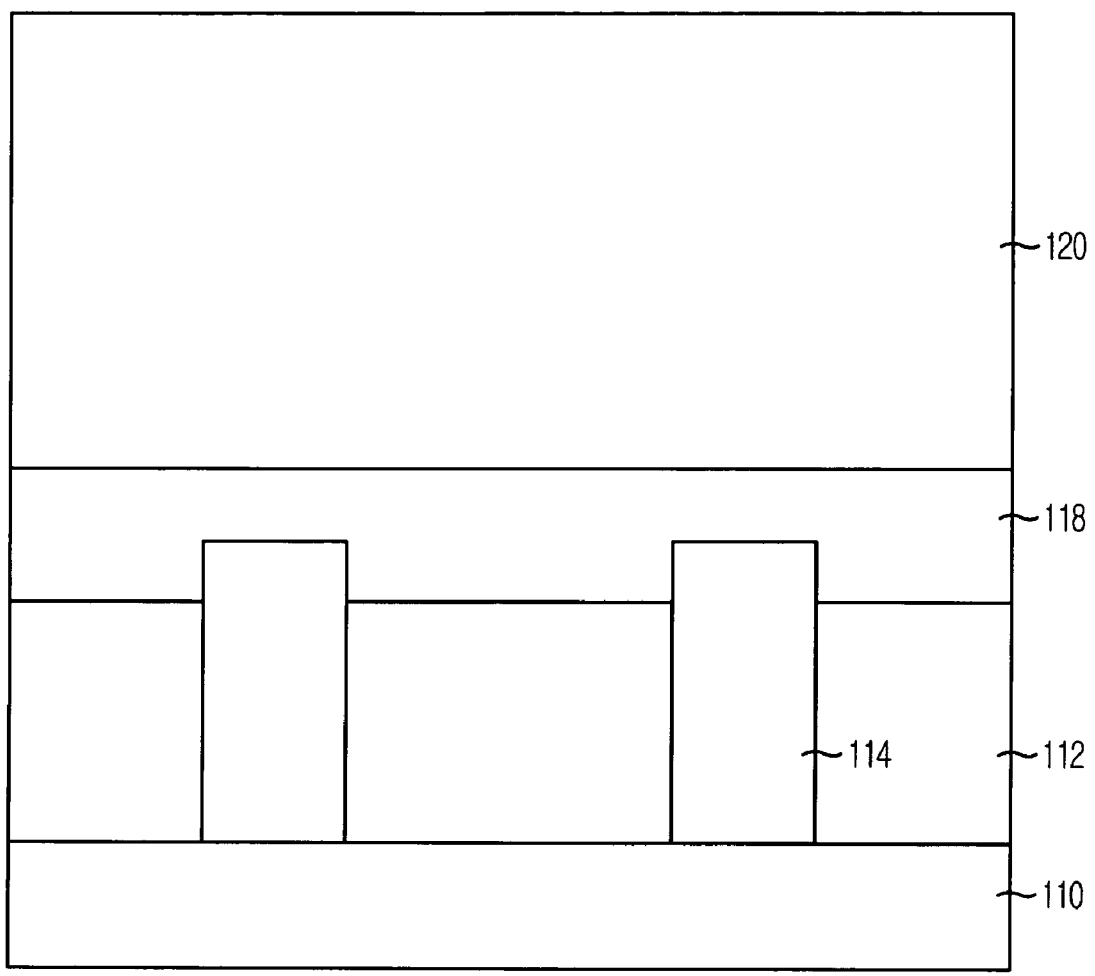

Next, as shown in FIG. 5, an etch stop layer 118 is formed over the recessed ILD layer 112 and the contact plugs 114. Herein, the etch stop layer 118 varies its thickness according to the spacing distance between the adjacent contact plugs 114, and thus, the etch stop layer 118 can be planarized. For example, the narrower the spacing distance between the adjacent contact plugs 114 becomes, the thinner the thickness of the etch stop layer 118 becomes. Herein, the etch stop layer 118 is formed in a thickness ranging from approximately 100 Å to approximately 2,000 Å.

For example, in consideration of the spacing distance between the adjacent contact plugs 114 generally being equal to or under 100 nm in this semiconductor device, the etch stop layer 118 is form in a thickness ranging from approximately 60 Å to approximately 1,000 Å. Preferably, the etch stop layer 118 is formed in a thickness of 750 Å. As the spacing distance between the contact plugs 114 becomes narrow, the etch stop layer 118 can easily fill up the topologically lower regions between the contact plugs 114, and the etch stop layer 118 can build itself up in a vertical direction. Therefore, a height difference between the etch stop layer 118 and the contact plugs 114 is gradually removed.

Herein, the etch stop layer 118 is formed with a material of an etch selectivity ratio different from the ILD layer 112 and the follow-up sacrificial insulation layer 120. For example, the etch stop layer 118 is formed with a nitride-based material. Preferably, silicon nitride ($Si_3N_4$) is used.

Then, the aforementioned sacrificial insulation layer 120 is formed on the etch stop layer 118. Herein, the sacrificial insulation layer 120 is formed by employing a chemical vapor deposition (CVD) method. Also, the sacrificial insulation layer 120 is formed with an oxide-based material identical to the ILD layer 112, and the sacrificial insulation layer 120 can be formed in a single or stacked layer.

Herein, the sacrificial insulation layer 120 and the etch stop layer 118 is formed in an entire thickness ranging from approximately 6,000 Å to approximately 30,000 Å.

Figure 6:
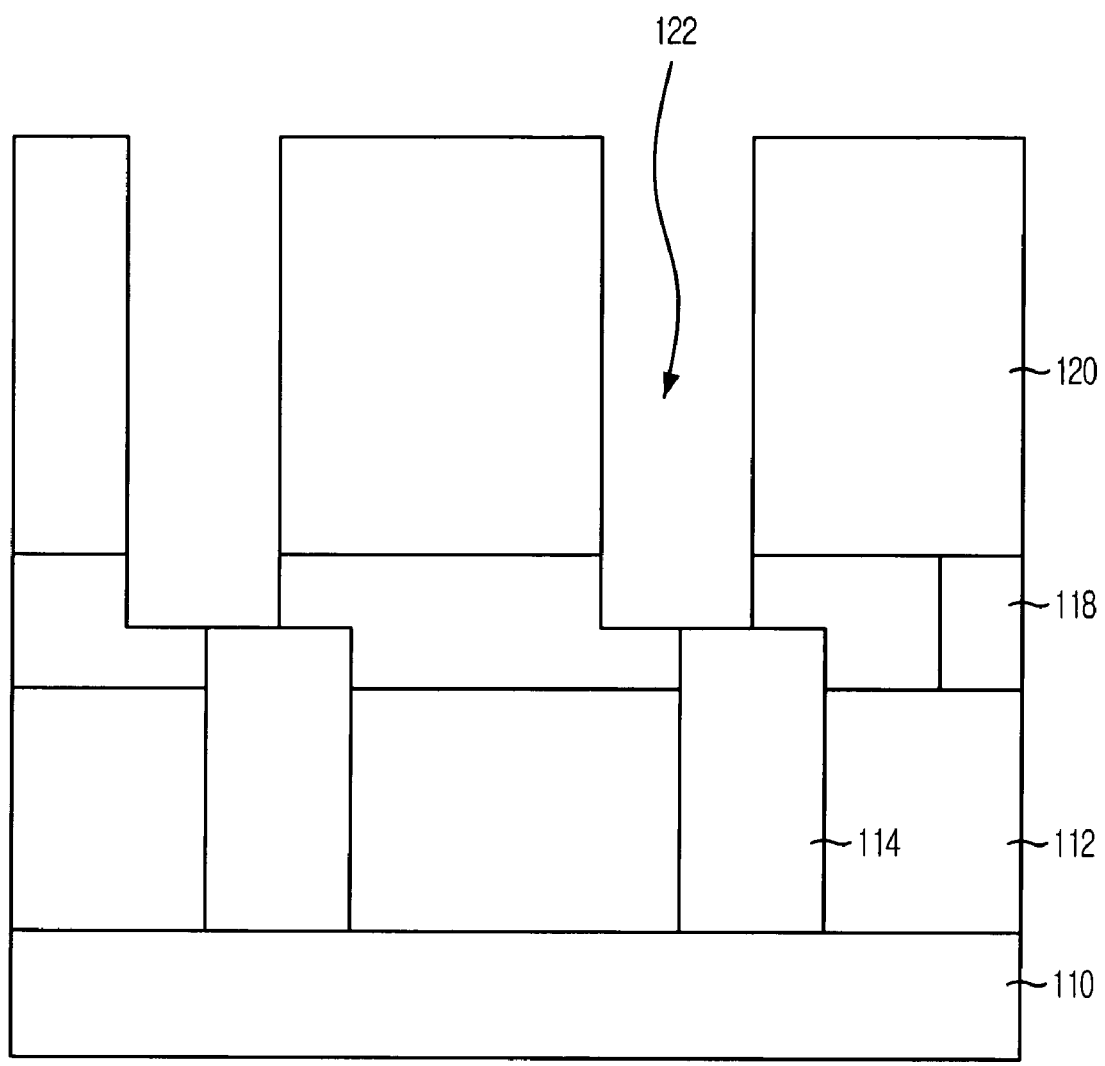

Subsequently, as shown in FIG. 6, a mask process and an etching process are performed to etch the sacrificial insulation layer 120. Herein, the etching process is stopped in the upper portion of the sacrificial insulation layer 120, firstly. Then, the sacrificial insulation layer 120 is etched until the top portions of the contact plugs 114 are exposed. As a result, openings 122 exposing portions of the contact plugs are formed. Herein, the openings 122 are generally formed in a misaligned position with the contact plugs 114, exposing a predetermined portion of the contact plugs 114.

Figure 7:
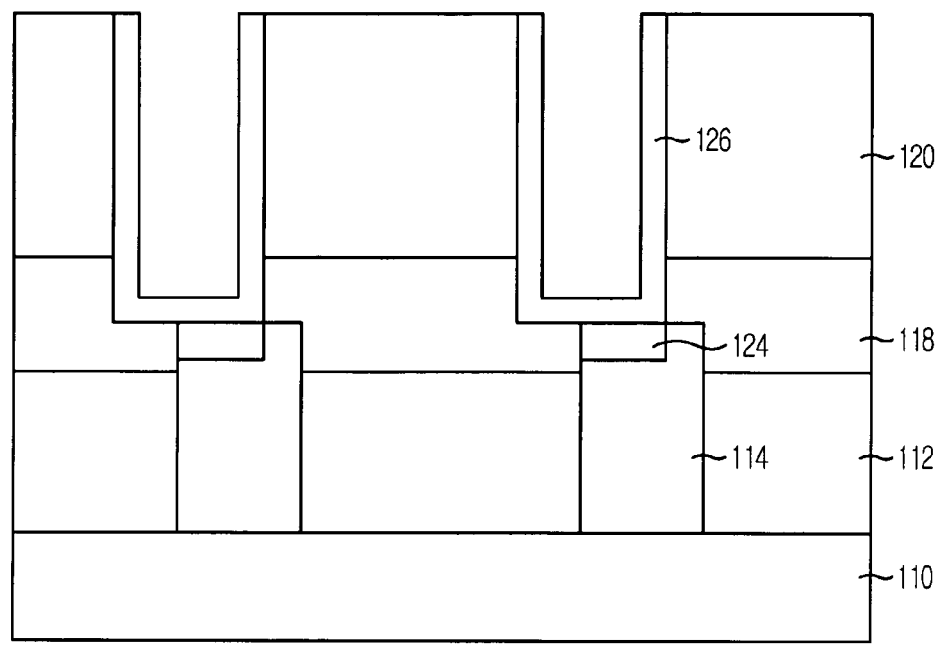

Furthermore, as shown in FIG. 7, barrier metal layers 124 are formed on top of the contact plugs 114, and exposed at the bottoms of the openings 122 (refer to FIG. 6). The barrier metal layers 124 function as ohmic contact layers to reduce contact resistance between the follow-up bottom electrodes 126 and the contact plugs 114.

Herein, the barrier metal layers 124 are formed by employing a material selected from the group consisting of $TiSi_x$, $ArSi_x$, and $CoSi_x$, where x is a natural number. For example, a layer of titanium (Ti), Zirconium (Zr) or cobalt (Co) is formed, and then a silicide process is performed to react the layer of Ti, Zr, or Co with the contact plugs 114 to form the barrier metal layers 124. Next, non-reacted portions of Ti, Zr, or Co are removed through a wet strip process. Preferably, $TiSi_x$ is used to form the barrier metal layers 124.

Next, a metal layer 126 for the bottom electrodes is formed over the sacrificial insulation layer 120 and the openings 122 with a difference in height. Herein, the metal layer 126 is formed by employing a CVD method or an atomic layer dielectric (ALD) method in a thickness ranging from approximately 50 Å to approximately 1,000 Å. Preferably, the metal layer 126 is formed with TiN.

Then, an etch-back process or a CMP process is performed to remove portions of the metal layer 126 exposed over the sacrificial insulation layer 120. Thus, bottom electrodes 126, each isolated by the sacrificial insulation layer 120, are formed over the openings 122.

Figure 8:
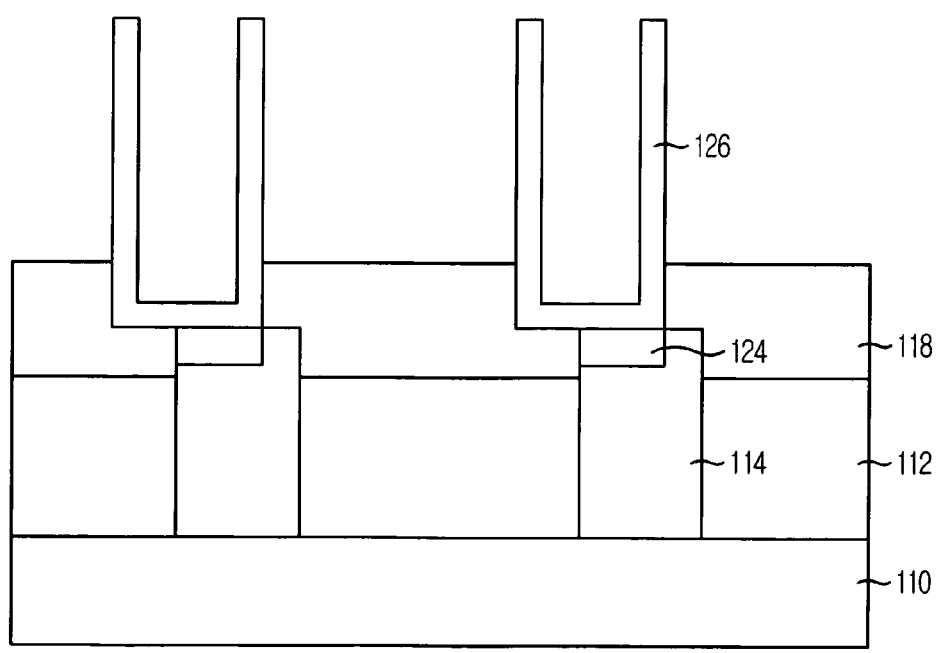

Moreover, as shown in FIG. 8, a wet dip out process is performed to remove the sacrificial insulation layer 120 (refer to FIG. 7). For example, the entire semiconductor structure including the bottom electrodes 126 is immersed in a buffered oxide etchant (BOE) solution, wherein hydrogen fluoride (HF) and $NH_4F$ are mixed in a ratio of approximately 100:1 or approximately 300:1, for approximately 10 seconds to approximately 3,600 seconds to resolve the sacrificial insulation layer 120. Preferably, the entire semiconductor structure is immersed in the BOE solution at a temperature ranging from approximately 4° C. to approximately 80° C. for approximately 120 seconds to remove the sacrificial insulation layer 120. Thus, a structure with certain portions of which protruding above the etch stop layer 118, i.e. the U-shaped cylinder-type bottom electrodes 126 are completed.

Figure 9:
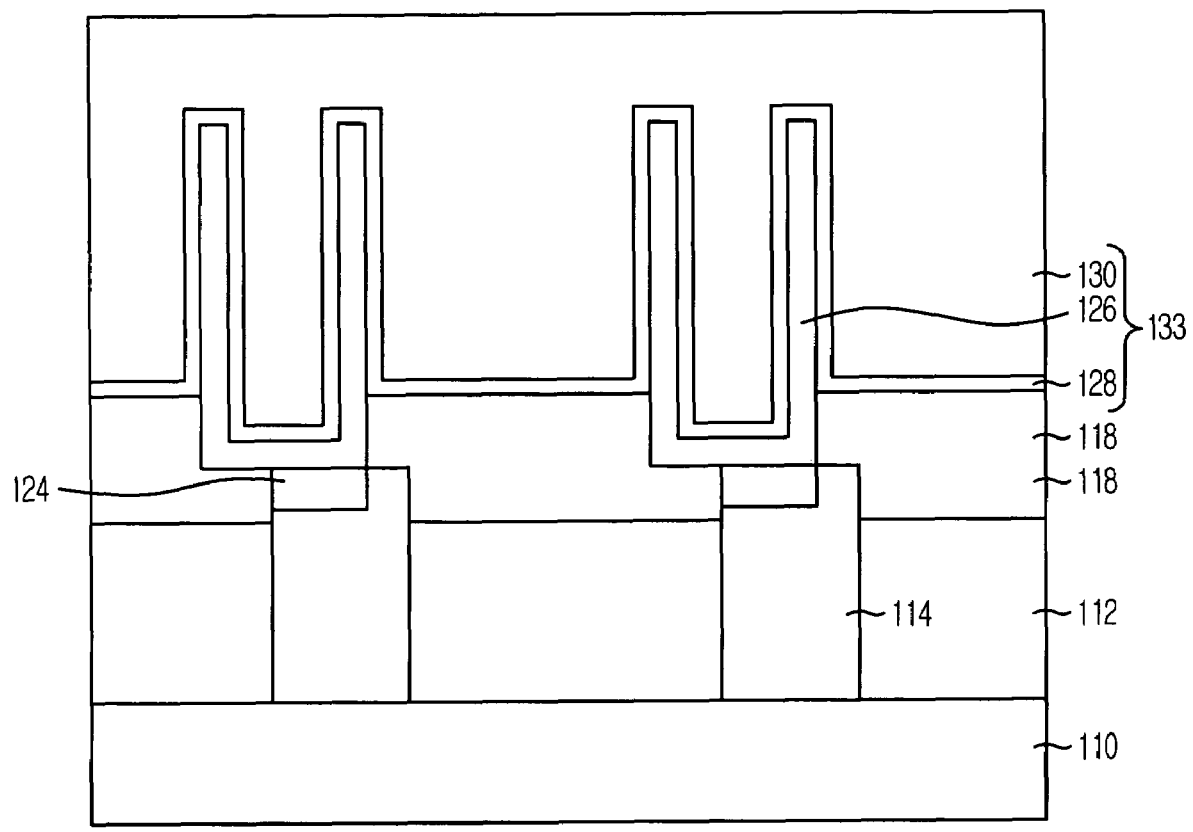

Subsequently, as shown in FIG. 9, a dielectric layer 128 is formed over the bottom electrodes 126 and the etch stop layer 118. Herein, the dielectric layer 128 is formed by employing a metal organic chemical vapor deposition (MOCVD) method or an ALD method in a thickness ranging from approximately 50 Å to approximately 400 Å. Especially, the dielectric layer 128 is formed by employing one material selected from the group consisting of TaON, $Ta_2O_5$, $TiO_2$, $Al_2O_3$, $HfO_2$, HfN, $SrTiO_3$ (Ba, Sr)$TiO_3$, (Pb, Sr)$TiO_3$, and a combination thereof.

Furthermore, an upper electrode 130 for a capacitor is formed on the dielectric layer 128. Herein, the upper electrode 130 is formed by employing one of a sputtering method, the CVD method and the ALD method in a thickness ranging from approximately 500 Å to approximately 3,000 Å. Especially, the upper electrode 130 is formed by employing one material selected from the group consisting of TiN, Ru and polysilicon. Thus, an MIM capacitor 133 with a stacked structure of: the bottom electrodes 126 made of metal/the dielectric layer 128/the upper electrode 130 made of metal, is completed.

In accordance with the specific embodiments of the present invention, the bunker defect of the ILD layer can be prevented by: recessing the ILD layer in a predetermined depth such that the bottom electrodes and the ILD layer are prevented from directly contacting each other; and forming the etch stop layer between the bottom electrodes and the ILD layer, wherein the etch stop layer has an etch selectivity ratio different from the ILD layer. Therefore, a fail of the chip is prevented, resulting in the improved yield of the semiconductor device.

The present application contains subject matter related to the Korean patent application No. KR 2005-0078288, filed in the Korean Patent Office on Aug. 25, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A method of fabricating a semiconductor device, comprising:

forming an ILD layer in which a contact plug is formed on a substrate;

recessing the ILD layer in a predetermined depth to protrude a predetermined portion of the contact plug above the ILD layer;

forming an etch stop layer over the ILD layer, covering the contact plug;

forming a sacrificial insulation layer on the etch stop layer with an etch selectivity ratio different from the etch stop layer;

etching a predetermined portion of the sacrificial insulation layer and the etch stop layer until a top portion of the contact plug is exposed to form an opening;

forming a bottom electrode of a capacitor over the opening and the sacrificial insulation layer; and removing the sacrificial insulation layer to expose the etched etch stop layer having the bottom electrode formed in the opening, wherein the bottom electrode is formed, allowing a bottom surface of the bottom electrode to contact with the etched etch stop layer and the top portion of the contact plug, and wherein a top surface of the contact plug is formed to contact with the bottom surface of the bottom electrode and the etched etch stop layer.

2. The method of claim 1, wherein the forming of the etch stop layer is carried out by controlling a thickness of the etch stop layer according to a spacing distance between the contact plug and an adjacent contact plug, so that the etch stop layer can be planarized.

3. The method of claim 2, wherein the thickness of the etch stop layer is determined by the spacing distance between the adjacent contact plugs.

4. The method of claim 2, wherein the thickness of the etch stop layer becomes thinner as the spacing distance between the adjacent contact plugs becomes narrow.

5. The method of claim 4, wherein the thickness of the etch stop layer ranges from approximately 100 Å to approximately 2,000 Å.

6. The method of claim 5, wherein an entire thickness of the etch stop layer and the sacrificial insulation layer ranges from approximately 6,000 Å to approximately 30,000 Å.

7. The method of claim 1, wherein at the recessing of the ILD layer, the predetermined depth ranges from approximately 100 Å to approximately 4,000 Å.

8. The method of claim 1, wherein the bottom electrode includes TiN.

9. The method of claim 8, wherein the forming of the bottom electrode comprises:

forming the bottom electrode over the opening and the sacrificial insulation layer; and isolating the bottom electrode by the sacrificial insulation layer through one of an etch-back process and a chemical mechanical polishing (CMP) process.

10. The method of claim 9, wherein the forming of the bottom electrode utilizes one of an atomic layer deposition (ALD) method and a chemical vapor deposition (CVD) method.

11. The method of claim 1, wherein the ILD layer and the sacrificial insulation layer include an oxide-based material.

12. The method of claim 1, wherein the etch stop layer is formed with a nitride-based material.

13. The method of claim 12, wherein the etch stop layer includes $Si_3N_4$.

14. The method of claim 1, after forming the opening, further comprising forming a barrier metal layer on the top portion of the contact plug exposed at the bottom of the opening.

15. The method of claim 14, wherein the forming of the barrier metal layer comprises:

forming a metal layer over the opening;

forming the barrier metal layer on the contact plug by performing a silicide process; and removing non-reacted portions of the metal layer during the silicide process.

16. The method of claim 15, wherein the metal layer includes one selected from the group consisting of titanium (Ti), cobalt (Co), and zirconium (Zr).

17. The method of claim 15, wherein the forming of the metal layer utilizes one of a CVD method and an ALD method.

18. The method of claim 14, wherein the barrier metal layer is formed by a material selected from the group consisting of $TiSi_x$, $CoSi_x$, and $ZrSi_x$, where X is a natural number.

19. The method of claim 1, wherein the removing of the sacrificial insulation layer comprises performing a wet dip out process.

20. The method of claim 19, wherein the wet dip out process utilizes a buffered oxide etchant (BOB) solution.

21. The method of claim 20, wherein the wet dip out process is performed at a temperature ranging from approximately 4° C. to approximately 80° C. for approximately 10 seconds to approximately 3,600 seconds.

22. The method of claim 1, after removing the sacrificial insulation layer, further comprising:

forming a dielectric layer over the bottom electrode and the etch stop layer; and forming an upper electrode of the capacitor on the dielectric layer.

23. The method of claim 22, wherein the forming of the dielectric layer utilizes one of a metal organic chemical vapor deposition (MOCVD) method and an ALD method.

24. The method of claim 22, wherein the dielectric layer includes a material selected from the group consisting of TaON, $Ta_2O_5$, $Al_2O_3$, $HfO_2$, HfN, $SrTiO_3$, $(Ba, Sr)TiO_3$, and $(Pb, Sr)TiO_3$.

25. The method of claim 22, wherein the forming of the upper electrode utilizes one of a sputtering method, a CVD method, and an ALD method.

26. The method of claim 25, wherein the upper electrode includes one selected from the group consisting of TiN, Ru, and polysilicon.

* * * * *